(12) United States Patent
Choi et al.

(10) Patent No.: US 9,401,370 B2
(45) Date of Patent: Jul. 26, 2016

(54) NON-VOLATILE MEMORY DEVICE AND METHOD FOR FABRICATING THE SAME

(75) Inventors: Sang-Moo Choi, Gyeonggi-do (KR);
Byung-Soo Park, Gyeonggi-do (KR);
Sang-Hyun Oh, Gyeonggi-do (KR);
Han-Soo Joo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 2 days.

(21) Appl. No.: 13/607,243

(22) Filed: Sep. 7, 2012

(65) Prior Publication Data
US 2013/0161717 A1 Jun. 27, 2013

(30) Foreign Application Priority Data
Dec. 21, 2011 (KR) .................... 10-2011-0139624

(51) Int. Cl.
*H01L 27/115* (2006.01)
*H01L 29/423* (2006.01)

(52) U.S. Cl.
CPC ...... *H01L 27/1157* (2013.01); *H01L 27/11578* (2013.01); *H01L 27/11582* (2013.01); *H01L 29/42324* (2013.01)

(58) Field of Classification Search
CPC ............ H01L 29/792; H01L 27/11517; H01L 27/11578; H01L 27/11582; H01L 29/42324; H01L 29/49; H01L 2924/13085
USPC .................... 257/316, 320, 322, 324, 326
See application file for complete search history.

(56) References Cited

U.S. PATENT DOCUMENTS

| | | | |
|---|---|---|---|
| 2008/0173933 A1* | 7/2008 | Fukuzumi et al. | 257/324 |
| 2009/0251963 A1* | 10/2009 | Seol et al. | 365/185.05 |
| 2010/0171163 A1* | 7/2010 | Kim et al. | 257/314 |
| 2010/0214838 A1* | 8/2010 | Hishida et al. | 365/185.11 |
| 2010/0226195 A1* | 9/2010 | Lue | 365/230.06 |
| 2010/0327323 A1* | 12/2010 | Choi | 257/202 |

\* cited by examiner

*Primary Examiner* — Tucker J Wright
*Assistant Examiner* — Mark Hatzilambrou
(74) *Attorney, Agent, or Firm* — IP & T Group LLP (57) ABSTRACT

A three-dimensional non-volatile memory device that may increase erase operation efficiency during an erase operation using Gate-Induced Drain Leakage (GIDL) current and a method for fabricating the three-dimensional non-volatile memory device. The non-volatile memory device includes a channel structure formed over a substrate including a plurality of inter-layer dielectric layers and a plurality of channel layers that are alternately stacked, and a first selection gate and a second selection gate that are disposed on a first side and a second side of the channel structure, wherein the first selection gate and the second selection gate are disposed on sidewalls of the multiple channel layers, respectively, wherein a work function of a material forming the first selection gate is different from a work function of a material forming the second selection gate.

8 Claims, 11 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-0139624, filed on Dec. 21, 2011, which is incorporated herein by reference in its entirety.

BACKGROUND

1. Field

Exemplary embodiments of the present invention relate to a non-volatile memory device and a fabrication method thereof, and more particularly, to a non-volatile memory device including a plurality of memory cells that are stacked perpendicularly to a substrate, and a method for fabricating the non-volatile memory device.

2. Description of the Related Art

Non-volatile memory devices retain data although a power supply is cut off. A plurality of types of non-volatile memory devices, such as a NAND flash memory, exist and are used.

As the integration degree of a two-dimensional non-volatile memory device where memory cells are formed in a single layer over a silicon substrate may reach a technical limitation, three-dimensional non-volatile memory devices where a plurality of memory cells are vertically stacked over a silicon substrate may be used. Three-dimensional non-volatile memory devices are divided into vertical channel devices where a plurality of word lines are stacked along channels formed perpendicularly to a substrate and vertical gate devices where a plurality of channel layers are stacked along gates formed perpendicularly to a substrate.

Although two dimensional memory cells use a portion of a substrate as a channel, the three-dimensional non-volatile memory devices do not use a part of a substrate as a channel. Therefore, the three-dimensional non-volatile memory devices cannot perform an erase operation that implants holes into a floating gate of a memory cell through a Fowler-Nordheim Tunneling by applying a high positive voltage to a substrate body having a high-concentration P-type impurity region. Instead, the three-dimensional non-volatile memory devices perform an erase operation by generating Gate-Induced Drain Leakage (GIDL) by applying a high voltage to a gate of a selection transistor and supply hot holes generated from the GIDL current to a channel.

However, since generating many electron-hole pairs may be difficult, the three-dimensional non-volatile memory devices may not efficiently perform an erase operation using GIDL current.

SUMMARY

An embodiment of the present invention is directed to a three-dimensional non-volatile memory device that may efficiently perform an erase operation using Gate-Induced Drain Leakage (GIDL) current, and a method for fabricating the three-dimensional non-volatile memory device.

In accordance with an embodiment of the present invention, a non-volatile memory device includes: a channel structure formed over a substrate including a plurality of inter-layer dielectric layers and a plurality of channel layers that are alternately stacked; and a first selection gate and a second selection gate that are disposed on a first side and a second side of the channel structure, wherein the first selection gate and the second selection gate are disposed on sidewalls of the multiple channel layers, respectively, wherein a work function of a material forming the first selection gate is different from a work function of a material forming the second selection gate.

In accordance with another embodiment of the present invention, a non-volatile memory device includes: a channel extending in a vertical direction from a substrate; and a plurality of inter-layer dielectric layers and a plurality of conductive layers that are alternately stacked along the channel, wherein an uppermost conductive layer among the multiple conductive layers forms a selection gate, and a first portion of the selection gate disposed on a first side of the channel is formed of a material having a first work function, and a second portion of the selection gate disposed on a second side of the channel is formed of a material having a second work function that is different from the first work function.

BRIEF DESCRIPTION OF THE DRAWINGS

FIGS. 4A to 7B describe a method for fabricating a non-volatile memory device in accordance with an embodiment of the present invention.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
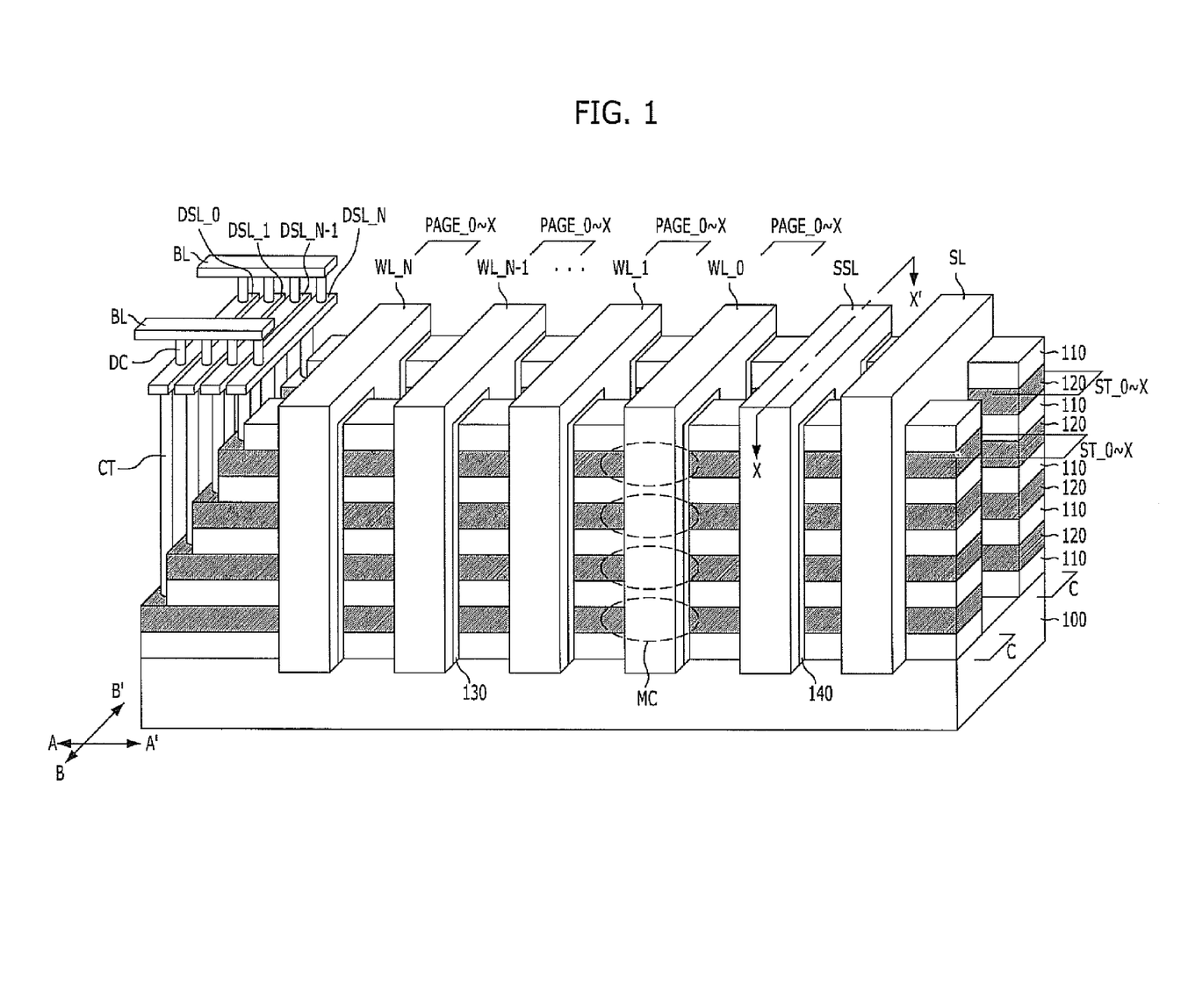
FIG. 1 is a perspective view illustrating a non-volatile memory device in accordance with an embodiment of the present invention.
Figure 2:
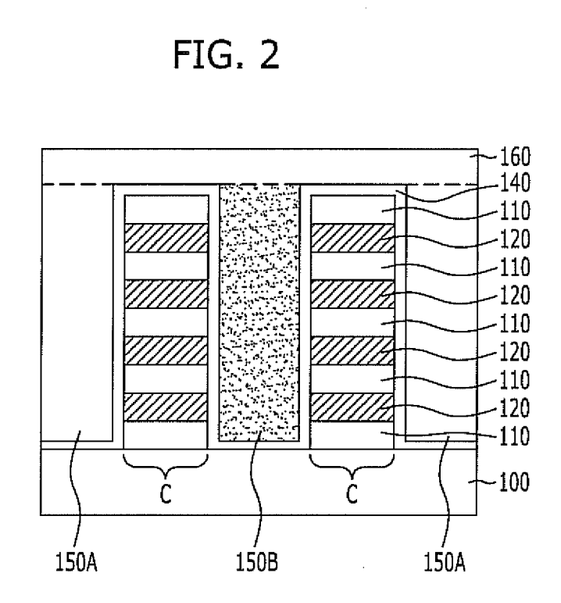
FIG. 2 is a cross-sectional view of the non-volatile memory device of FIG. 1 taken along an X-X' line.

Hereafter, a non-volatile memory device and a method for fabricating the non-volatile memory device in accordance with an embodiment of the present invention are described with reference to FIGS. 1 to 7B FIG. 1 is a perspective view illustrating a non-volatile memory device in accordance with an embodiment of the present invention, and FIG. 2 is a cross-sectional view of the non-volatile memory device of FIG. 1 taken along an X-X' line. The non-volatile memory device shown in FIGS. 1 and 2 is a vertical gate-type three-dimensional non-volatile memory device where gates are vertically stretched from a substrate.

Referring to FIG. 1, the non-volatile memory device includes a substrate 100, a channel structure C, word lines WL_0 to WL_N, a source selection line SSL, a source line SL, drain selection lines DSL_0 to DSL_N, and bit lines BL. The channel structure C is disposed over the substrate 100 and extends in a first direction, which is A-A' direction in the drawing. The word lines WL_0 to WL_N extend in a second direction, which is B-B' direction in the drawing, crossing the first direction. The word lines WL_0 to WL_N are disposed on the sidewalls of a plurality of channel layers 120 included in the channel structure C. The drain selection lines DSL_0 to DSL_N are disposed over stair-shaped ends of the channel structure C and extend in the second direction. The bit lines BL are disposed over the drain selection lines DSL_0 to DSL_N and extend in the first direction.

The substrate 100 may be a monocrystalline silicon substrate, and the substrate 100 may include a structure (not shown) such as wells and an insulation layer.

The channel structure C includes a plurality of inter-layer dielectric layers 110 and a plurality of channel layers 120 that are alternately stacked. The inter-layer dielectric layers 110 may be oxide layers or nitride layers. The channel layers 120 may be a monocrystalline silicon layer or a polysilicon layer doped with an impurity. A plurality of channel structures C may be provided and disposed in parallel with a space between the plurality of channel structures C.

The word lines WL_0 to WL_N may be disposed in parallel to each other with a space between them while extending in the second direction. Each of the word lines WL_0 to WL_N has a first portion disposed over the channel structures C and extending in the second direction and a second portion vertically extending down from the first portion toward the space between the channel structures C. As a result, the second portion is disposed on the sidewall of the channel structure C with a memory layer 130, which is to be described later, between them. The word lines WL_0 to WL_N may include a conductive material, such as a semiconductor material, e.g., polysilicon doped with an impurity, or a metal material.

The memory layer 130 is interposed between the word lines WL_0 to WL_N and the channel structures C, and the memory layer 130 substantially performs a function of storing data by trapping charges. In addition, the memory layer 130 electrically insulates the word lines WL_0 to WL_N and the channel structures C from each other. The memory layer 130 may be of a triple layer structure including a tunnel insulation layer, a charge trapping layer, and a charge blocking layer. The tunnel insulation layer may be an oxide layer and disposed adjacent to the channel structure C, and the charge blocking layer may be an oxide layer and disposed adjacent to the word lines WL_0 to WL_N. The charge trapping layer may be a nitride layer and disposed between the tunnel insulation layer and the charge blocking layer.

The source selection line SSL extends in the second direction in parallel to the word lines WL_0 to WL_N, and the source selection line SSL is disposed between the word lines WL_0 to WL_N and the source line SL. The source selection line SSL may have the same shape as the word lines WL_0 to WL_N. In other words, the source selection line SSL includes a first portion that is disposed over the channel structure C and extends in the second direction and a second portion vertically extending down from the first portion toward the space between the channel structures C. As a result, the second portion is disposed on the sidewall of the channel structure C with a gate insulation layer 140, which is to be described later, between them. The source selection line SSL will be described in detail with reference to FIG. 2.

The gate insulation layer 140 may be an oxide layer and interposed between the source selection line SSL and the channel structure C.

The source line SL extends in the second direction in parallel to the source selection line SSL. Similarly to the word lines WL_0 to WL_N or the source selection line SSL, the source line SL may have a first portion that is disposed over the channel structure C and extends in the second direction and a second portion that vertically extends down from the first portion toward the space between the channel structures C. As a result, the second portion may directly contact the sidewall of the channel structure C. The vertical height of the source line SL may be different from those of the word lines WL_0 to WL_N or the source selection line SSL. The source line SL may include a conductive material, such as a semiconductor material, e.g., polysilicon doped with an impurity.

The drain selection lines DSL_0 to DSL_N are disposed on the stair-shaped ends of the channel structure C and couples drain selection transistors (not shown) that are extended and arrayed in the second direction with each other. More specifically, channel contacts CT are formed on exposed ends of the channel layers 120, and channels DC of drain selection transistors are disposed over the channel contacts CT. The drain selection lines DSL_0 to DSL_N extend in the second direction while surrounding the channels DC of drain selection transistors, and a gate insulation layer (not shown) is disposed between the drain selection lines DSL_0 to DSL_N and the channels DC.

The bit lines BL are disposed over the drain selection lines DSL_0 to DSL_N and extend in the first direction. The bit lines BL are coupled with the channels DC of drain selection transistors that are arrayed in the first direction. The bit lines BL extend in the first direction to cross the word lines WL, the source selection line SSL, and the source line SL.

Although not illustrated in the drawing, elements disposed on to the left of the source line SL may be symmetrically disposed on to the right of the source line SL.

The non-volatile memory device described above includes a plurality of unit memory cells MC. Each unit memory cell MC includes any one channel layer 120, any one word line WL disposed on the channel layer 120, and a memory layer 130 interposed between the channel layer 120 and the word line WL. The memory cells MC may be arrayed in the form of a matrix along the first and second directions in the horizontal direction.

Memory cells MC sharing the same channel layer 120 form one string ST, and accordingly, each channel structure C includes strings ST_0 to ST_X. The number of strings included in each channel structure C may be the same as the number of channel layers stacked in each channel structure C. A stack of strings ST_0 to ST_X sharing the same channel structure C are coupled with the same bit line BL. Also, a stack of strings ST_0 to ST_X are commonly coupled with on source line SL.

Memory cells MC sharing the same word line WL form one page PAGE, and accordingly, a stack of pages PAGE_0 to PAGE_X is disposed for each word line WL. A desired page PAGE among the stack of pages PAGE_0 to PAGE_X sharing one word line WL may be selected by a drain selection transistor.

The non-volatile memory device having the above-described structure may perform a read/write operation by using a plurality of drain selection transistors and selecting a desired page PAGE while controlling the word lines WL_0 to WL_N and the bit lines BL in a well-known method. In short, a desired page PAGE may be selected by turning on a drain selection transistor coupled with the desired page PAGE during a read/write operation, and unselected drain selection transistors are turned off.

An erase operation of the non-volatile memory device having the above-described structure may be performed by applying a high voltage to the source selection line SSL to generate Gate-Induced Drain Leakage (GIDL) current and produce hot holes and supplying the hot holes to the channel layers 120. In this embodiment of the present invention, erase efficiency is increased by forming the source selection line SSL as shown in FIG. 2.

Referring to FIG. 2, the source selection line SSL includes an first portion 160 that is disposed over the channel structure C and extends in the second direction and a second portion 150A and 150B that vertically extends down toward the space between the channel structures C. The second portion 150A and 150B forms a source selection transistor by being disposed on each of the channel layers 120, and the second portion 150A and 150B is referred to as a source selection gate 150A and 150B, hereafter.

The source selection gate 150A and 150B includes a first source selection gate 150A and a second source selection gate 150B that have different work functions. The first source selection gate 150A and the second source selection gate 150B are alternately disposed in the second direction. As a result, the work functions of the first and second source selection gates 150A and 150B that are disposed on a first side and a second side of any one channel structure C are different. In this embodiment of the present invention, the first source selection gate 150A may be formed of a semiconductor material doped with an N-type impurity, for example, N-type polysilicon, and the second source selection gate 150B may be formed of a semiconductor material doped with a P-type impurity, for example, P-type polysilicon. However, the scope of the present invention is not limited to these exemplary materials, and any conductive material may be used as long as the work functions of the first source selection gate 150A and the second source selection gate 150B are different. The first portion 160 may be formed of the same material as the first source selection gate 150A or the second source selection gate 150B, for example, an N-type polysilicon or a P-type polysilicon.

When the first source selection gate 150A and the second source selection gate 150B having different work functions are disposed on both sides of the channel structure C, an energy band bending phenomenon is increased to raise tunneling of electrons, and as a result, the generation of GIDL current is increased as well. This is described in detail below with reference to experimental results of FIGS. 3A and 3B.

Figure 3A:
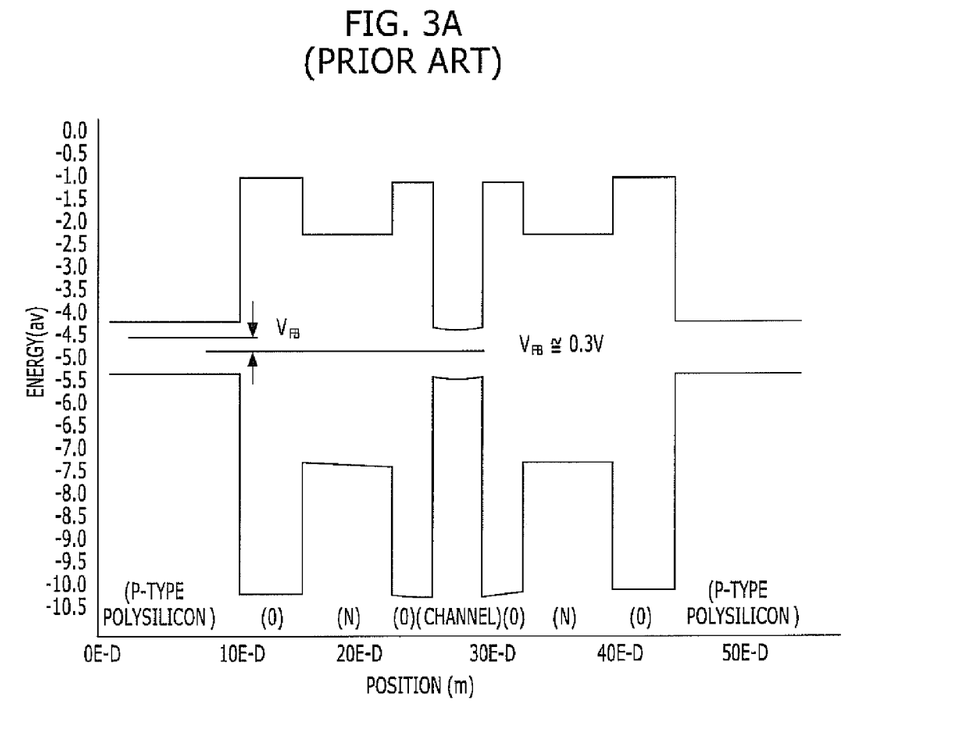
FIG. 3A is an energy band diagram of a conventional non-volatile memory device.
Figure 3B:
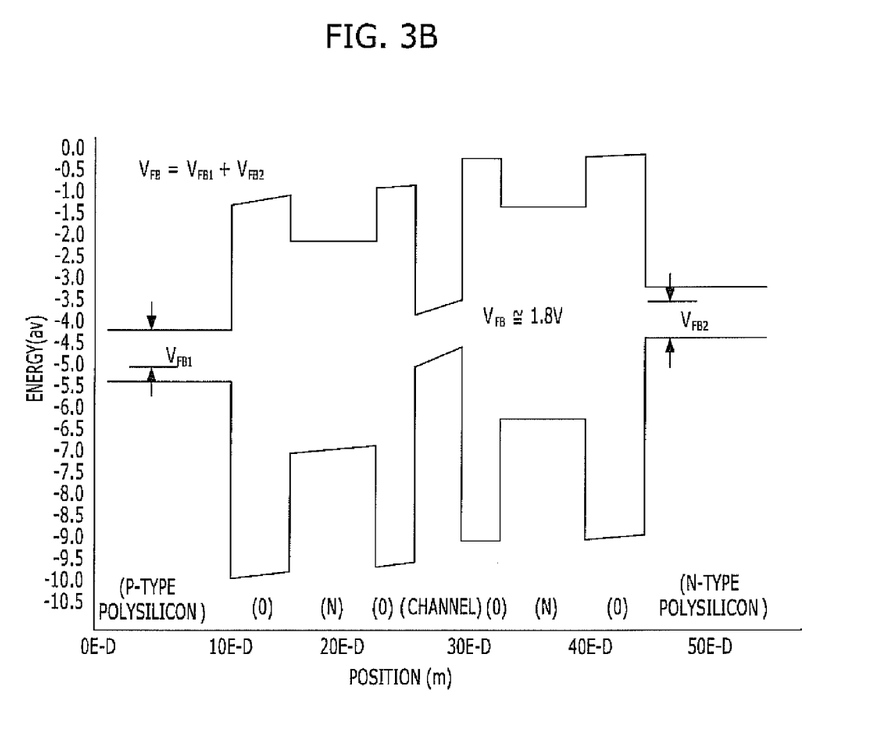
FIG. 3B is an energy band diagram of a non-volatile memory device in accordance with an embodiment of the present invention.

FIG. 3A is an energy band diagram of a conventional non-volatile memory device. FIG. 3B is an energy band diagram of a non-volatile memory device in accordance with an embodiment of the present invention.

Referring to FIG. 3A, when P-type polysilicon is disposed on both sides of a channel as a selection gate with a memory layer (O-N-O) therebetween, little energy band bending occurs and accordingly, flat band voltage $V_{FB}$ is as small as approximately 0.3V.

Referring to FIG. 3B, when P-type polysilicon is disposed on a first side and N-type polysilicon is disposed on the second side of a channel with a memory layer (O-N-O) therebetween, more energy band bending occurs than that of FIG. 3A, and accordingly, flat band voltage $V_{FB}$ is increased to approximately 1.8V.

When the flat band voltage $V_{FB}$ is increased and a high voltage is applied to a selection gate, electron tunneling to a channel is increased, and accordingly, GIDL current is increased to raise the production of hot holes that are used during an erase operation. Therefore, erase operation efficiency is increased.

FIGS. 4A to 7B describe a method for fabricating a non-volatile memory device in accordance with an embodiment of the present invention. FIGS. 4A, 5A, 6A and 7A illustrate a method for fabricating the non-volatile memory device of FIG. 1 taken along X-X' line, and FIGS. 4B, 5B, 6B and 7B are plan views illustrating a portion where the source selection line SSL is formed.

Figure 4A:
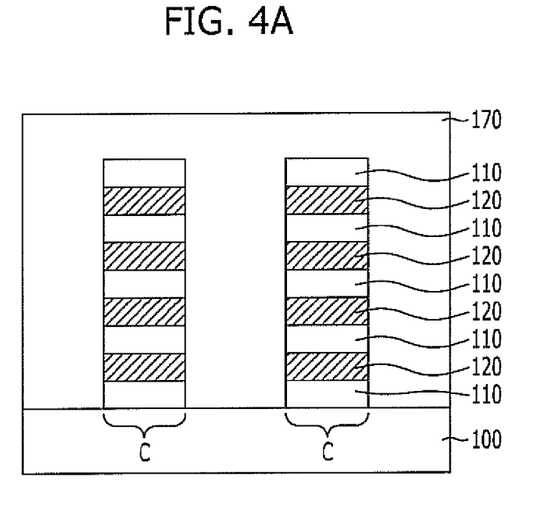
Figure 4B:
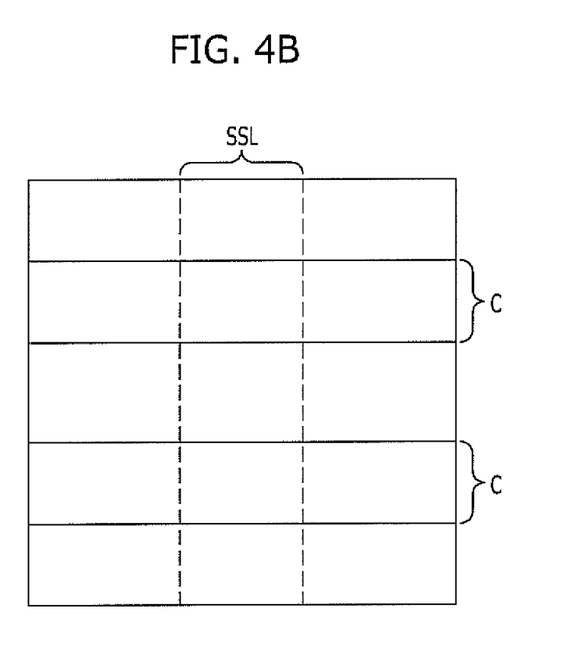

Referring to FIGS. 4A and 4B, the inter-layer dielectric layers 110 and the channel layers 120 are alternately stacked over the substrate 100, and channel structures C extending in the first direction are formed by patterning the inter-layer dielectric layers 110 and the channel layers 120 that are alternately stacked.

Subsequently, an insulation layer 170 covering the channel structures C is formed over the substrate 100. The insulation layer 170 is formed of a material having a different etch rate from that of the inter-layer dielectric layers 110. When the inter-layer dielectric layers 110 are nitride layers, the insulation layer 170 may be an oxide layer.

In the plan views, a portion where the source selection line SSL is to be formed is marked with dotted line.

Figure 5A:
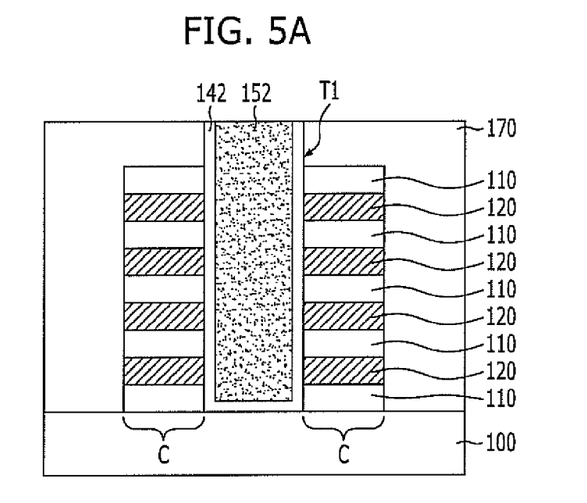
Figure 5B:
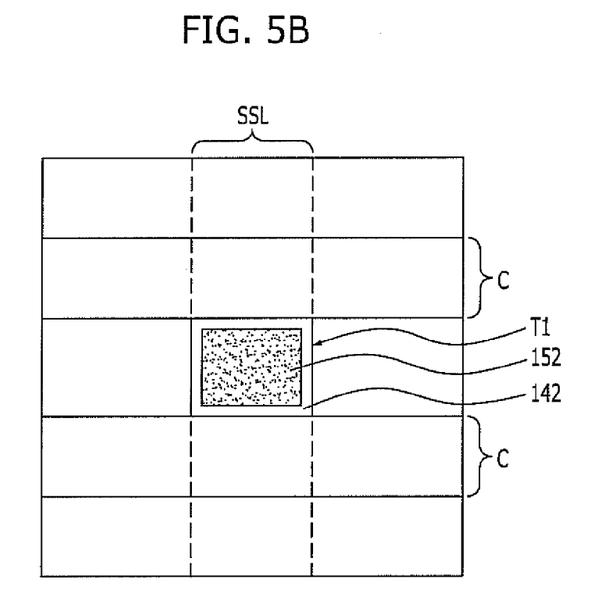

Referring to FIGS. 5A and 5B, a mask pattern (not shown) exposing a portion where the second source selection gate 150B is to be formed is formed over the insulation layer 170, and first trenches T1 that expose the substrate 100 are formed by using the mask pattern (not shown) as an etch barrier and etching the insulation layer 170. In this embodiment of the present invention, the first trenches T1 expose the substrate 100, but the scope of the present invention is not limited this exposure method, and the first trenches T1 may have a depth that exposes sidewalls of the channel layers 120.

Subsequently, a gate insulation layer 142 is formed along internal walls of the first trench T1, and the first trenches T1 are subsequently filled with a conductive layer for forming the second source selection gate 150B, for example, a P-type polysilicon layer 152.

Figure 6A:
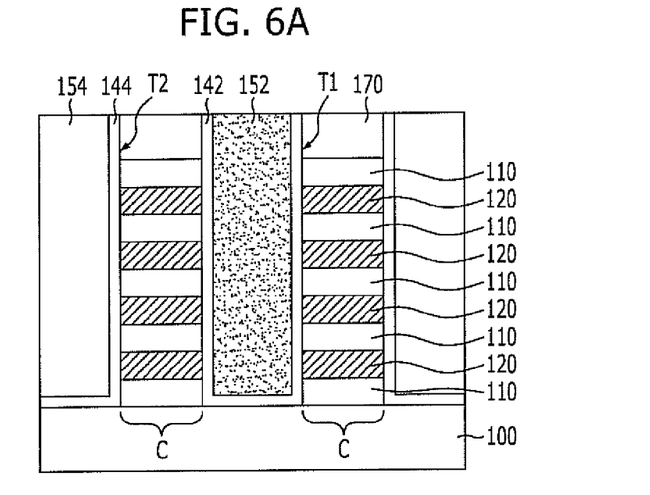
Figure 6B:
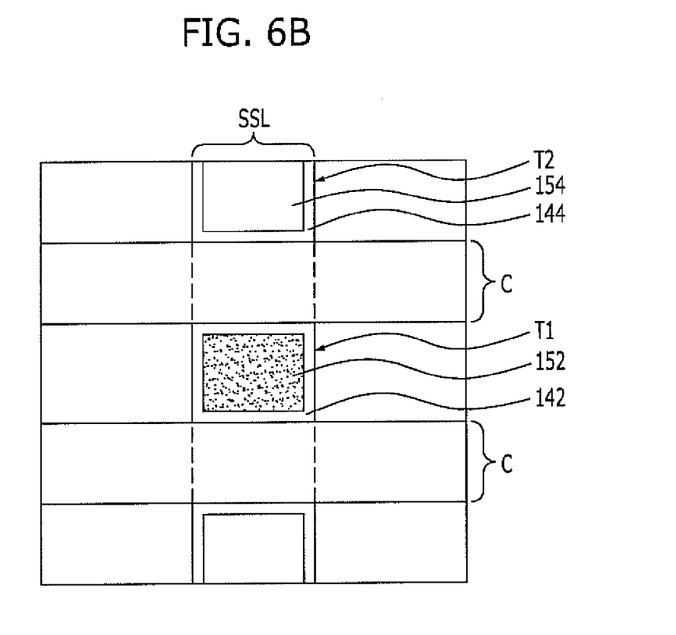

Referring to FIGS. 6A and 6B, a mask pattern (not shown) exposing a portion where the first source selection gate 150A is to be formed is formed over the insulation layer 170, and a second trenches T2 that expose the substrate 100 are formed by using the mask pattern (not shown) as an etch barrier and etching the insulation layer 170. In this embodiment of the present invention, the second trenches T2 expose the substrate 100, but the scope of the present invention is not limited this exposure method, and the second trenches T2 may have a depth that exposes sidewalls of the channel layers 120.

Subsequently, a gate insulation layer 144 is formed along internal walls of the second trenches T2, and the second trenches T2 are subsequently filled with a conductive layer for forming the first source selection gate 150A, for example, an N-type polysilicon layer 154.

Figure 7A:
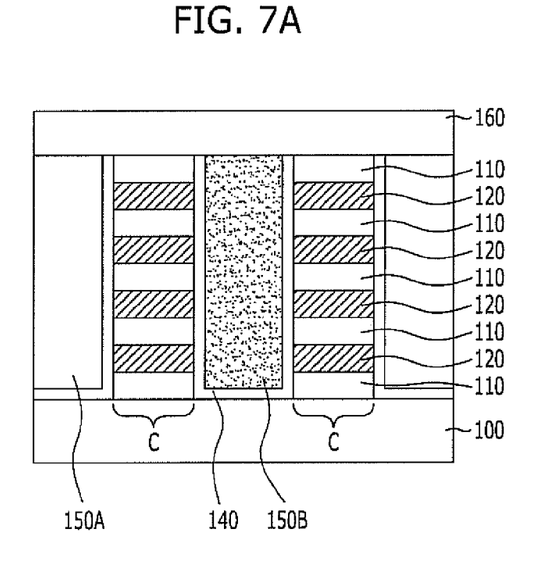
Figure 7B:
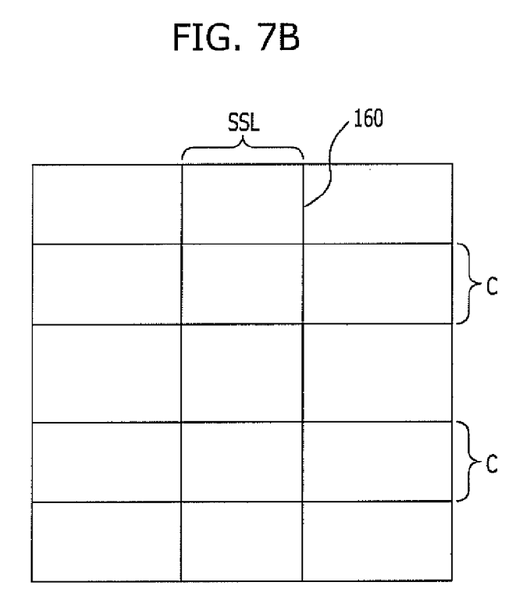

Referring to FIGS. 7A and 7B, the structure of FIGS. 6A and 6B may be planarized. The planarization process may be performed until the uppermost inter-layer dielectric layer 110 of the channel structures C is exposed. The planarization process may be omitted.

Subsequently, the first portion 160 of the source selection line SSL is formed by forming a conductive layer covering the resultant substrate after the planarization and patterning the conductive layer. The conductive layer may be an N-type polysilicon layer or a P-type polysilicon layer.

Although a non-volatile memory device that is substantially the same as the non-volatile memory device shown in FIGS. 1 and 2 may be fabricated through the above-described process, the scope of the present invention is not limited the above-described process. The non-volatile memory device of FIGS. 1 and 2 may be fabricated through a plurality of procedural steps.

Meanwhile, the scope of the present invention is not limited to the non-volatile memory device shown in FIGS. 1 and 2. As long as selection gates having different work functions are disposed on a first side and a second side of a channel, non-volatile memory devices of a plurality of structures may be fabricated in accordance with embodiments of the present invention. Exemplary structures are described below with reference to FIGS. 8 to 12.

Figure 8:
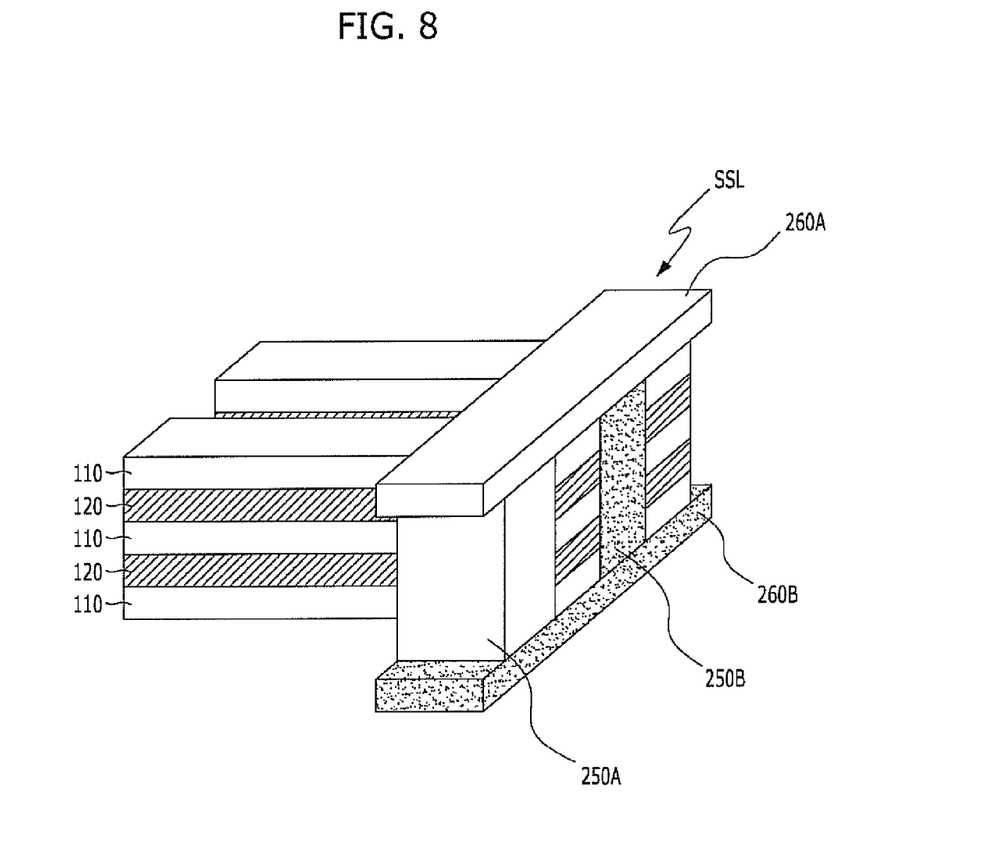
FIG. 8 is a perspective view of a non-volatile memory device in accordance with another embodiment of the present invention.

FIG. 8 is a perspective view of a non-volatile memory device in accordance with another embodiment of the present invention. The drawing focuses on the portion where the source selection line SSL is formed, and the other portion of the structure is substantially the same as that of the non-volatile memory device shown in FIGS. 1 and 2. Hereafter, the non-volatile memory device in accordance with the embodiment of the present invention is described focusing on the difference from the non-volatile memory device of FIGS. 1 and 2.

Referring to FIG. 8, the source selection line SSL of the non-volatile memory device includes first and second source selection gates 250A and 250B, a first extended portion 260A, and a second extended portion 260B. The first and second source selection gates 250A and 250B are alternately arrayed in the second direction. The first extended portion 260A is disposed over the channel structure C and extends in the second direction. The first extended portion 260A is formed of the same material as that of the first source selection gate 250A. The second extended portion 260B is disposed under the channel structure C and extends in the second direction. The second extended portion 260B is formed of the same material as that of the second source selection gate 250B. For example, the first source selection gate 250A and the first extended portion 260A may be of P-type polysilicon, and the second source selection gate 250B and the second extended portion 260B may be of N-type polysilicon, or the first source selection gate 250A and the first extended portion 260A may be of N-type polysilicon, and the second source selection gate 250B and the second extended portion 260B may be of P-type polysilicon.

This embodiment of the present invention is different from the previously described embodiment in that the first extended portion 260A and the second extended portion 260B of the source selection line SSL exist over and under the channel structure C. In this embodiment, since the first extended portion 260A and the first source selection gate 250A are formed of the same material, voltage may be easily transferred to the first source selection gate 250A through the first extended portion 260A. Also, since the second extended portion 260B and the second source selection gate 250B are formed of the same material, voltage may be easily transferred to the second source selection gate 250B as well through the second extended portion 260B.

The non-volatile memory device shown in FIG. 8 may be fabricated according to substantially the same method as the fabrication method of FIGS. 4A to 7B, except that a process of forming the second extended portion 260B is further performed by depositing a conductive layer over a substrate and patterning the conductive layer before the formation of the channel structure C.

Figure 9:
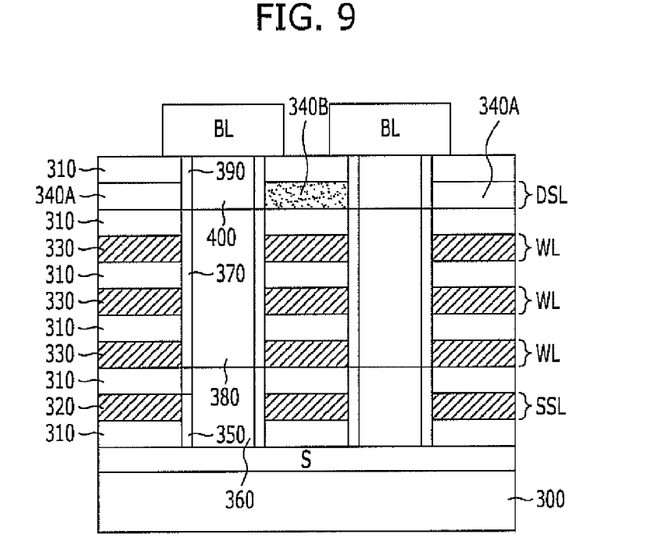
FIGS. 9 to 10 are a cross-sectional view and a plan view of a non-volatile memory device in accordance with yet another embodiment of the present invention.
Figure 10:
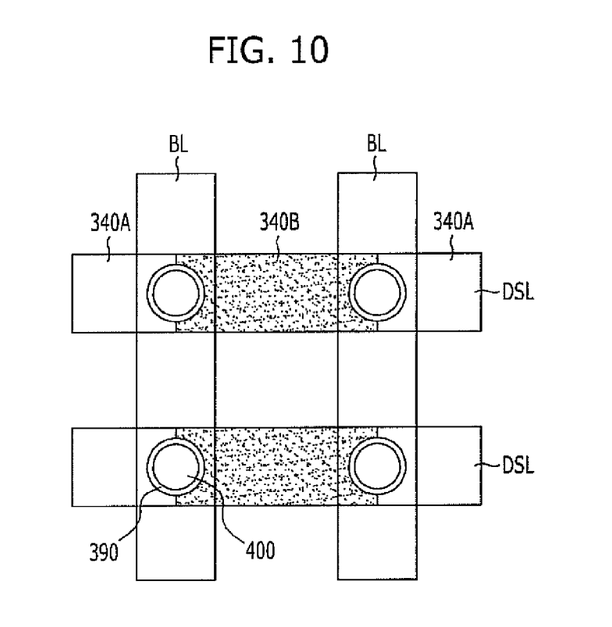

FIGS. 9 to 10 are a cross-sectional view and a plan view of a non-volatile memory device in accordance with yet another embodiment of the present invention. FIGS. 9 to 10 show a vertical-channel-type three-dimensional non-volatile memory device including channels that extend perpendicularly to a substrate.

Referring to FIGS. 9 and 10, the non-volatile memory device includes a substrate 300, channel layers 360, 380, and 400 that are vertically extended from the substrate 300, a source selection transistor formed along the channel layers 360, 380, and 400, a plurality of memory cells, and a drain selection transistor.

More specifically, the source selection transistor includes a pillar-type channel layer 360, a source selection gate 320 surrounding the pillar-type channel layer 360, and a gate insulation layer 350 interposed between the pillar-type channel layer 360 and the source selection gate 320. The source selection gate 320 extends in a cross-sectional direction of the drawing and forms a source selection line SSL. Over and under the source selection gate 320, an inter-layer dielectric layer 310 is disposed.

Also, each of the memory cells includes a pillar-type channel layer 380 connected to the pillar-type channel layer 360, a plurality of cell gates 330 surrounding the pillar-type channel layer 380, and a memory layer 370 interposed between the pillar-type channel layer 380 and the cell gates 330. Each of the cell gates 330 extends in a cross-sectional direction of the drawing to form a word line WL. Over and under each cell gate 330, the inter-layer dielectric layer 310 is disposed.

Also, the drain selection transistor includes a pillar-type channel layer 400 connected to the pillar-type channel layer 380, drain selection gates 340A and 340B surrounding the pillar-type channel layer 400, and a gate insulation layer 390 interposed between the pillar-type channel layer 400 and the drain selection gates 340A and 340B. The drain selection gates 340A and 340B extend in a cross-sectional direction of the drawing to form a drain selection line DSL. Over and under each drain selection gate 340A or 340B, the inter-layer dielectric layer 310 is disposed. Detailed structure of the drain selection line DSL will be described later.

The upper end and the lower end of the channel layers 360, 380, and 400 respectively contact bit lines BL that extend in a direction crossing the cross-sectional direction of the drawing and a source region S that is formed in the upper portion of the substrate 300.

The non-volatile memory device having the above-described structure may perform an erase operation by generating hot holes and supplying the generated hot holes to the channel layers 360, 380, and 400. The hot holes are generated by applying a high voltage to the drain selection line DSL to generate GIDL current. The drain selection line DSL has a structure described below to increase erase operation efficiency.

When it is assumed that the pillar-type channel layer 400 is divided into two portions in the cross-sectional direction of the drawing, the drain selection line DSL includes a first drain selection gate 340A that contacts one of the two portions of the pillar-type channel layer 400 and a second drain selection gate 340B that contacts both portions of the pillar-type channel layer 400.

The first drain selection gate 340A and the second drain selection gate 340B have different work functions, and they are alternately disposed in the cross-sectional direction of the drawing. In this embodiment, the first drain selection gate 340A may be a semiconductor material doped with an N-type impurity, for example, N-type polysilicon, and the second drain selection gate 340B may be a semiconductor material doped with a P-type impurity, for example, P-type polysilicon. However, the scope of the present invention is not limited to this structure, and any conductive materials may be used as long as the first drain selection gate 340A and the second drain selection gate 340B have different work functions.

When the first drain selection gate 340A and the second drain selection gate 340B having different work functions are disposed on both sides of the channel layer 400 of the drain selection transistor, an energy band bending phenomenon is increased to increase tunneling of electrons, and accordingly, more GIDL current is generated.

Figure 11:
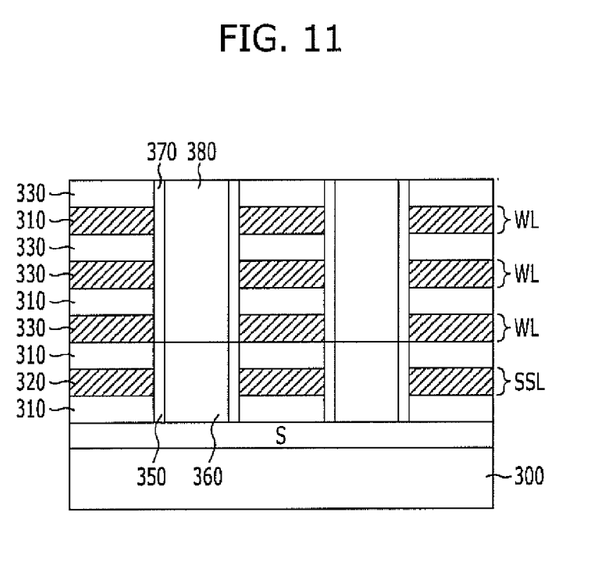
FIGS. 11 to 12 are cross-sectional views illustrating a method for fabricating a non-volatile memory device in accordance with still another embodiment of the present invention.
Figure 12:
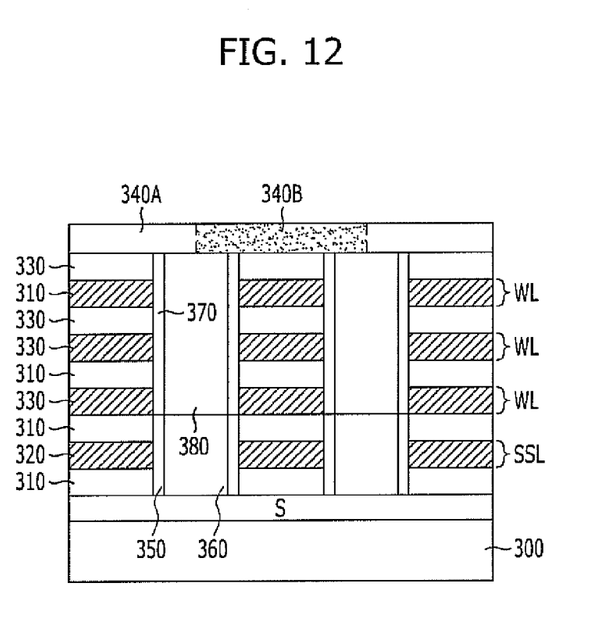

FIGS. 11 to 12 are cross-sectional views illustrating a method for fabricating a non-volatile memory device in accordance with still another embodiment of the present invention.

Referring to FIG. 11, a source region S is formed in the upper portion of the substrate 300. The source region S may be formed by doping an impurity into the substrate 300.

Subsequently, an inter-layer dielectric layer 310, a conductive layer for forming a source selection gate 320, and the inter-layer dielectric layer 310 are sequentially stacked over the substrate 300, and channel-forming holes that expose the substrate 300 are subsequently formed by selectively etching the stacked structure. Subsequently, a gate insulation layer 350 is formed on internal walls of each channel-forming hole, and the channel-forming holes including the gate insulation layer 350 are filled with the pillar-type channel layer 360. As a result, source selection transistors are formed.

Subsequently, a conductive layer for forming cell gates 330 and the inter-layer dielectric layer 310 are alternately stacked over the substrate structure including source selection transistor, and channel-forming holes that expose the gate insulation layer 350 and the pillar-type channel layer 360 are subsequently formed by selectively etching the stacked structure. Subsequently, a memory layer 370 is formed on the internal wall of the channel-forming holes, and the channel-forming holes including the memory layer 370 are filled with a channel layer 380. As a result, a plurality of memory cells are formed.

Referring to FIG. 12, a conductive layer for forming the drain selection gates 340A and 340B, for example, a polysilicon layer, is formed over the substrate structure including the memory cells.

Subsequently, a mask pattern (not shown) that covers the polysilicon layer where the second drain selection gate 340B is to be formed, and the polysilicon layer not covered by the mask pattern is doped with an N-type impurity. As a result, the first drain selection gate 340A formed of an N-type polysilicon layer may be formed.

Also, a mask pattern (not shown) that covers polysilicon layer where the first drain selection gate 340A is formed, and the polysilicon layer not covered by the mask pattern is doped with a P-type impurity. As a result, the second drain selection gate 340B formed of a P-type polysilicon layer may be formed.

Referring back to FIG. 9, after the inter-layer dielectric layer 310 covering the polysilicon layers 340A and 340B doped with an impurity is formed, channel-forming holes that expose the memory layer 370 and the channel layer 380 are formed by selectively etching the inter-layer dielectric layer 310 and the polysilicon layers 340A and 340B doped with an impurity. Subsequently, a gate insulation layer 390 is formed on internal walls of the channel-forming holes, and the channel-forming holes including the gate insulation layer 390 are filled with the channel layer 400. As a result, a drain selection transistor is formed.

Subsequently, a conductive layer for forming bit lines is formed over the substrate structure including the drain selection transistor, and bit lines BL are formed by subsequently patterning the conductive layer.

A non-volatile memory device that is substantially the same as the non-volatile memory device of FIGS. 9 and 10 may be fabricated through the above-described process, but the scope of the present invention is not limited the above-described process, and those skilled in the art will realize that the non-volatile memory device shown in FIGS. 9 and 10 may be fabricated through a plurality of procedural steps.

According to an embodiment of the present invention, the non-volatile memory device three-dimensional non-volatile memory device and a fabrication method thereof may increase erase operation efficiency during an erase operation using Gate-Induced Drain Leakage (GIDL) current.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a channel structure formed over a substrate and including a plurality of inter-layer dielectric layers and a plurality of channel layers that are alternately stacked along a vertical direction perpendicular to the substrate, wherein the channel structure extends along a first horizontal direction parallel to the substrate and has a first sidewall and a second sidewall;
   memory cells sharing each of the channel layers and arranged along the first horizontal direction to form a string; a first selection gate electrode and a second selection gate electrode that are disposed on the first sidewall and the second sidewall of the channel structure, respectively, and are conductive, wherein the first selection gate electrode and the second selection gate electrode are located at a same level in the vertical direction and located at a same end of the string in the first horizontal direction; and
   an insulation layer interposed between the first selection gate electrode and the channel structure, and between the second selection gate electrode and the channel structure,
   wherein a work function of the first selection gate electrode is different from a work function of the second selection gate electrode so that the work function of the first selection gate electrode and the work function of the second selection gate electrode are located at a same point along the channel structure with respect to a line normal to the sidewalls of the channel structure, and
   the first selection gate electrode, each of the channel layers and the insulation layer interposed therebetween form a first selection transistor, and the second selection gate electrode, each of the channel layers and the insulation layer interposed therebetween form a second selection transistor.

2. The non-volatile memory device of claim 1, wherein the first selection gate electrode is formed of a semiconductor material having a first conductive type, and the second selection gate electrode is formed of a semiconductor material having a second conductive type that is different from the first conductive type.

3. The non-volatile memory device of claim 2, wherein the first selection gate electrode is formed of N-type polysilicon, and the second selection gate electrode is formed of P-type polysilicon.

4. The non-volatile memory device of claim 1, wherein the channel structure includes a plurality of channel structures, and
the first selection gate electrode and the second selection gate electrode are alternately arrayed along a horizontal direction parallel to the substrate, between the channel structures.

5. The non-volatile memory device of claim 1, further comprising:
an extended portion disposed over or under the channel structure, extending in a first direction crossing the channel structure and coupled with the first selection gate and the second selection gate.

6. The non-volatile memory device of claim 1, further comprising:
a first extended portion disposed over the channel structure, extending in a first direction crossing the channel structure and coupled with the first selection gate electrode, and
a second extended portion disposed under the channel structure, extending in the first direction and coupled with the second selection gate electrode.

7. The non-volatile memory device of claim 6, wherein the first extended portion is formed of a same material as a material forming the first selection gate electrode, and
the second extended portion is formed of a same material as a material forming the second selection gate electrode.

8. The non-volatile memory device of claim 1, wherein a Gate-Induced Drain Leakage (GIDL) current generated according to a voltage applied to the first selection gate electrode and the second selection gate electrode is used in an erase operation mode.

* * * * *